US008972944B2

(12) United States Patent
Petras

(10) Patent No.: US 8,972,944 B2
(45) Date of Patent: *Mar. 3, 2015

(54) COORDINATING AND CONTROLLING DEBUGGERS IN A SIMULATION ENVIRONMENT

(71) Applicant: Synopsys, Inc., Mountain View, CA (US)

(72) Inventor: Dietmar Petras, Langerwehe (DE)

(73) Assignee: Synopsys, Inc., Mountain View, CA (US)

( * ) Notice: Subject to any disclaimer, the term of this patent is extended or adjusted under 35 U.S.C. 154(b) by 9 days.

This patent is subject to a terminal disclaimer.

(21) Appl. No.: 13/802,712

(22) Filed: Mar. 14, 2013

(65) Prior Publication Data

US 2013/0212566 A1 Aug. 15, 2013

Related U.S. Application Data

(63) Continuation of application No. 11/637,376, filed on Dec. 11, 2006, now Pat. No. 8,423,959.

(51) Int. Cl.
*G06F 9/44* (2006.01)
*G06F 11/36* (2006.01)
*G06F 9/455* (2006.01)
*G06F 17/50* (2006.01)

(52) U.S. Cl.
CPC ............ *G06F 11/3664* (2013.01); *G06F 9/455* (2013.01); *G06F 17/5009* (2013.01)
USPC ............................. 717/124; 717/134; 717/135

(58) Field of Classification Search
None
See application file for complete search history.

(56) References Cited

U.S. PATENT DOCUMENTS

| 5,493,672 | A | * | 2/1996 | Lau et al. ........................ 703/21 |
| 5,784,593 | A | * | 7/1998 | Tseng et al. .................... 703/15 |
| 5,937,179 | A | * | 8/1999 | Swoboda ...................... 716/103 |
| 6,014,512 | A | * | 1/2000 | Mohamed et al. .............. 703/27 |
| 6,058,393 | A | * | 5/2000 | Meier et al. .................... 717/124 |
| 6,230,114 | B1 | * | 5/2001 | Hellestrand et al. ........... 703/13 |
| 6,324,683 | B1 | * | 11/2001 | Fuh et al. ....................... 717/124 |
| 6,378,124 | B1 | * | 4/2002 | Bates et al. .................... 717/129 |
| 6,389,379 | B1 | * | 5/2002 | Lin et al. ........................ 703/14 |
| 6,543,049 | B1 | * | 4/2003 | Bates et al. .................... 717/129 |
| 6,681,384 | B1 | * | 1/2004 | Bates et al. .................... 717/129 |
| 6,708,326 | B1 | * | 3/2004 | Bhattacarya .................. 717/124 |
| 6,718,294 | B1 | * | 4/2004 | Bortfeld ......................... 703/20 |
| 6,751,583 | B1 | * | 6/2004 | Clarke et al. ................... 703/17 |
| 6,823,518 | B1 | * | 11/2004 | Bliss et al. ..................... 719/310 |
| 6,862,694 | B1 | * | 3/2005 | Tormey et al. .................. 714/34 |
| 6,868,454 | B1 | * | 3/2005 | Kubota et al. ................. 709/237 |
| 6,892,324 | B1 | * | 5/2005 | French et al. ............. 714/38.14 |
| 6,961,926 | B2 | * | 11/2005 | Koyama ......................... 717/129 |
| 6,990,657 | B2 | * | 1/2006 | Hunter et al. ................. 717/129 |
| 7,107,578 | B1 | * | 9/2006 | Alpern .......................... 717/124 |
| 7,124,404 | B1 | * | 10/2006 | Bebout et al. ................. 717/127 |
| 7,331,002 | B2 | * | 2/2008 | Rivard et al. ................... 714/35 |
| 7,480,825 | B2 | * | 1/2009 | Vorbach .................... 714/38.14 |
| 7,599,821 | B1 | * | 10/2009 | Hou et al. ........................ 703/2 |
| 7,698,118 | B2 | * | 4/2010 | Reblewski ...................... 703/13 |

(Continued)

*Primary Examiner* — Insun Kang
(74) *Attorney, Agent, or Firm* — Fenwick & West LLP

(57) ABSTRACT

A simulation environment, in one embodiment, includes a debugger server, one or more debuggers, and one or more debugger adapters. Each debugger adapter couples a corresponding debugger to the debugger server. The debugger server coordinates the run mode of the debugger adapters. Each debugger adapter controls the run mode of its corresponding debugger.

18 Claims, 3 Drawing Sheets

(56) References Cited

U.S. PATENT DOCUMENTS

| | | | |
|---|---|---|---|
| 7,711,535 B1* | 5/2010 | Brookes et al. | 703/14 |
| 7,742,905 B2* | 6/2010 | Vanspauwen et al. | 703/13 |
| 7,849,450 B1* | 12/2010 | Rydh et al. | 717/131 |
| 7,984,304 B1* | 7/2011 | Waldspurger et al. | 713/187 |
| 2001/0021985 A1* | 9/2001 | Aldridge et al. | 714/38 |
| 2002/0032559 A1* | 3/2002 | Hellestrand et al. | 703/22 |
| 2002/0049576 A1* | 4/2002 | Meyer | 703/14 |
| 2002/0059542 A1* | 5/2002 | Debling | 714/28 |
| 2002/0100024 A1* | 7/2002 | Hunter et al. | 717/129 |
| 2002/0104071 A1* | 8/2002 | Charisius et al. | 717/109 |
| 2002/0133325 A1* | 9/2002 | Hoare et al. | 703/17 |
| 2002/0162051 A1* | 10/2002 | Bolding et al. | 714/34 |
| 2002/0199173 A1* | 12/2002 | Bowen | 717/129 |
| 2003/0074177 A1* | 4/2003 | Bowen | 703/22 |
| 2003/0097613 A1* | 5/2003 | Kageshima | 714/26 |
| 2004/0250244 A1* | 12/2004 | Albrecht | 717/135 |
| 2005/0010880 A1* | 1/2005 | Schubert et al. | 716/4 |
| 2005/0144585 A1* | 6/2005 | Daw et al. | 716/18 |
| 2005/0229163 A1* | 10/2005 | Bates et al. | 717/129 |
| 2005/0283674 A1* | 12/2005 | Rivard et al. | 714/34 |
| 2005/0289396 A1* | 12/2005 | Hooper et al. | 714/34 |
| 2006/0090136 A1* | 4/2006 | Miller et al. | 715/734 |
| 2006/0195822 A1* | 8/2006 | Beardslee et al. | 717/124 |
| 2006/0195825 A1* | 8/2006 | Vanspauwen et al. | 717/135 |
| 2006/0206873 A1* | 9/2006 | Argade | 717/135 |
| 2006/0253842 A1* | 11/2006 | Pees et al. | 717/129 |
| 2008/0141222 A1* | 6/2008 | Alpern | 717/125 |
| 2009/0132991 A1* | 5/2009 | Ganai et al. | 716/18 |
| 2010/0251217 A1* | 9/2010 | Miller | 717/126 |
| 2011/0307233 A1* | 12/2011 | Tseng et al. | 703/14 |

* cited by examiner

COORDINATING AND CONTROLLING DEBUGGERS IN A SIMULATION ENVIRONMENT

CROSS REFERENCE TO RELATED APPLICATIONS

This application is a continuation of U.S. application Ser. No. 11/637,376, filed Dec. 11, 2006, now issued as U.S. Pat. No. 8,423,959, which is incorporated by reference in its entirety.

BACKGROUND

Computing devices have made significant contributions toward the advancement of modern society and are utilized in a number of applications to achieve advantageous results. Numerous devices, such as personal computers, laptop computers, servers, minicomputers, mainframe computers, workstations, computer aided design (CAD) system, simulators, emulators, automatic test equipment (ATE) systems, and distributed computer systems, have facilitated increased productivity and reduced costs in analyzing and communicating data in most areas of business, science, engineering, education and entertainment. As computing devices continue to progress, techniques such as multi-threading, virtualization and the like are being utilized to achieve increased performance.

For example, the virtualization of a physical computing device creates a uniform hardware image, implemented in software, on which operating systems and applications run. Each virtual machine is a software representation of a physical machine that can run or host a guest operating system and one or more applications. A typical virtualized computing platform includes a physical machine and one or more virtual machines for executing a host operating system and one or more applications.

To simulate virtualized computing platforms during development, multiple simulator components and debuggers are utilized to simulate the platform. The debuggers are applications attached to the simulator components for analyzing, displaying and modifying the state of the simulation. The conventional debuggers are assumed to be the master of the run mode of their corresponding simulation. However, the conventional debugger server is attached to the simulation in such a way that the run mode of the simulation is shared between all debuggers. Furthermore, the conventional debugger server forces a debugger to always abort its current operation. When the simulation stops, it is not always useful to abort the current operation of the debugger (e.g., to return from the current function). Furthermore, when the simulation continues, the debugger has to automatically choose one of the possible ways to continue the simulation. There is a substantial risk that it may choose an operation that does not fit to the current intention of the user. Therefore, there is a continuing need for improved multi-debugger techniques.

SUMMARY

Embodiments of the present invention are directed toward techniques for coordinating and controlling debuggers in a simulation environment. In one embodiment, the simulation environment includes a debugger server to coordinate run modes of one or more debugger adapters. Each debugger adapter couples a corresponding debugger client to the debugger server. The debugger adapters are utilized to control the run mode of their corresponding debugger clients.

In another embodiment, a method of coordinating debuggers in a simulation environment includes coupling one or more debuggers to the simulation. A debugger adapter couples a corresponding debugger to a debugger server to thereby couple the debugger to the simulation. Thereafter, the debugger server may drive the run mode of one or more other debugger adapters utilizing the debugger server.

In yet another embodiment, a method of controlling debuggers in a simulation environment includes coupling a debugger to a debugger server through a debugger adapter. Thereafter, the state of the simulation may be modified by the debugger adapter. In one instance, a debugger adapter may make requests to the debugger server to change the run mode of one or more other debugger adapters currently coupling a corresponding debugger to the debugger server. In another instance, the debugger adapter may accept or reject a request from the debugger server to change the run mode of the debugger adapter's corresponding debugger.

BRIEF DESCRIPTION OF THE DRAWINGS

Embodiments of the present invention are illustrated by way of example and not by way of limitation, in the figures of the accompanying drawings and in which like reference numerals refer to similar elements.

DETAILED DESCRIPTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 1:
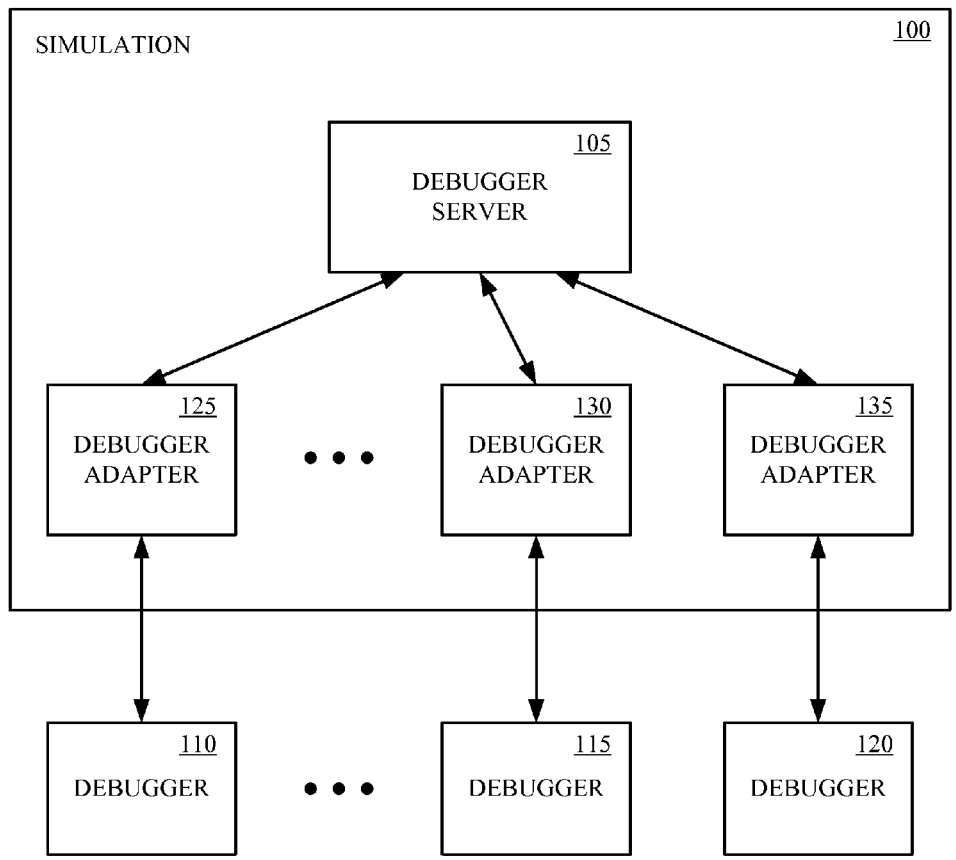
FIG. 1 shows a block diagram of an exemplary simulation environment, in accordance with one embodiment of the present invention.

Referring to FIG. 1, an exemplary simulation environment, in accordance with one embodiment of the present invention, is shown. The simulation environment 100 includes a debugger server 105, one or more debugger clients 110-120 and one or more debugger adapters 125-135. A debugger adapter 125-135 is communicatively coupled between the debugger server 105 and each debugger client 110-120 that is currently coupled to the debugger server 105. One debugger client may also use multiple debugger adapters, for example when it is debugging different components of the hardware simulation model at the same time (e.g., two instruction set simulators). Multiple debugger clients may also share the same debugger adapter. The debugger clients are also referred to herein as debuggers. The simulation environment 100 is also referred to here as the simulation.

The debuggers 110-120 are generally not part of the simulation, but are instead stand-alone applications that run on the same computing device as the simulation or another computing device in such a way that they communicate with the simulation via a network connection. The debug target of a debugger may be the whole hardware model of the simulation or one or multiple components within the hardware mode (e.g., the target of a debugger may be an instruction set simulator).

The debugger server 105 is adapted to coordinate the run modes of the debugger adapter 125-135. The debugger server 105 controls the run mode of the simulation after the start of the simulation but before a debugger couples to the simulation 100. The debugger server 105 may also enable the coupling of debugger clients 110-120 to the simulation environment 100. The debugger server 105 also maintains run state information about debuggers 110-120 that are currently coupled to the simulation environment 100. The debugger server 105 may also drive the simulation 100 into a given run mode. The debugger server 105 may also enable the un-coupling of debugger clients 110-120 from the simulation environment 100. In addition, the debugger server 105 also controls the run mode of the simulation 100 after the last debugger un-couples from the simulation environment 100.

Each debugger adapter 125-135 is utilized to control the run mode of its respective debugger 110-120. The debugger adapter 125-135 responds to requests from the debugger server on behalf its corresponding debugger 110-120. The debugger adapter 125-135 also makes requests to the debugger server 105 on behalf of its debugger 110-120. For instance, each debugger adapter 125-135 is adapted to couple its corresponding debugger 110-120 to the simulation environment 100. Each debugger adapter 125-135 may retrieve information about the run mode of any other debugger currently coupled to the simulation environment 100. Each debugger adapter 125-135 may request that the other debugger adapters currently coupled to the simulation environment 100 change their run mode to a given state. Each debugger adapter 125-135 may also accept or reject a request to change the run mode of its corresponding debugger 110-120 to a given state. In addition, each debugger 110-120 may un-couple from its corresponding debugger adapter 125-135, thereby un-coupling from the simulation environment 100. Thus, each debugger adapter 125-135 is a proxy for its respective debugger client 110-120.

The debugger adapters 125-135 may be implemented as an application programming interface (API). The debugger adapters 125-135 may be a standardized debugger adapter that operates with a number of debugger clients, a custom debugger adapter provided by the debugger server 105, and/or a custom debugger adapter provided by its corresponding debugger client. The communication between each debugger adapter 125-135 and the debugger server 105 may be in accordance with a single protocol. The communication between a given debugger adapter 125-135 and its corresponding debugger 110-120 may be in accordance with any number of protocols. Thus, the communication between the debugger adapter 125-135 and its debugger 110-120 may be transparent to the debugger server 105.

In another embodiment, the simulation could be split into multiple components and each component could be simulated by a different simulation environment as co-simulation. Single components can be executed by real hardware. The debugger server of the master component acts as a central coordinating instance of all debuggers attached to any component of the co-simulation.

Figure 2:
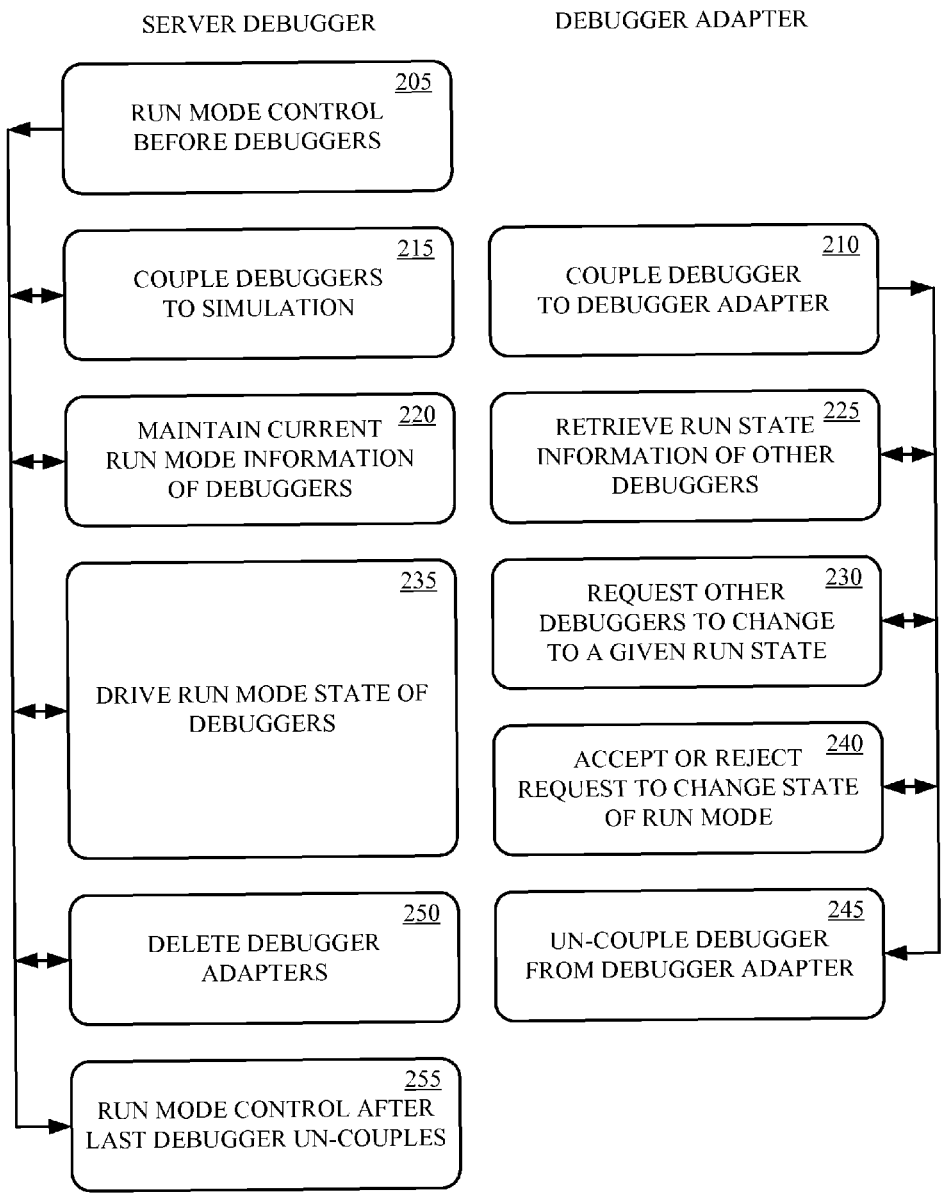
FIG. 2 shows a flow diagram of a method of coordinating and controlling debuggers in a simulation environment, in accordance with one embodiment of the present invention.

Referring now to FIG. 2, a method of coordinating and controlling debuggers in a simulation, in accordance with one embodiment of the present invention is shown. The method will be described with reference to the exemplary simulation shown in FIG. 1. The method includes processes performed by a debugger server 105 and processes performed by each debugger adapter 125-135 on behalf of a corresponding debugger 110-1120.

The method begins with starting a simulation 100 utilizing the debugger server 105. The debugger server 105 controls the run mode of the simulation after the start of the simulation but before any debugger client couples to the simulation 100, at 205. Possible run mode states may include: run, stop, step, stalled, and finished. In the 'run' state the simulation begins executing behavioral code. In the 'stop' state, the simulation stops without executing any behavioral code. In the 'step' state, a single step (e.g., one instruction) in the behavioral code is executed. After execution of the step the run mode automatically changes to the stop state. In the 'stalled' state, the simulation runs by does not execute any behavioral code. This is comparable to the execution of no-operation-instructions. In the 'finish' state, the simulation terminates by executing a finish procedure.

In one implementation, the debugger server 105 includes a Boolean configuration parameter that determines if the run mode of the simulation is stopped when the simulation started. The value of the configuration parameter may be set based on start arguments of the simulation or user configurations. Stopping the simulation 100 at the time of initiation is realized by an instance of the simulation stopper mechanism of the debugger server that stops the whole simulation.

Control of the run mode by the debugger server 105 enables starting the simulation 100 in the stopped run mode before any behavioral code is executed. Thereafter, any debugger 110-120 that subsequently attaches may begin executing the behavior code of the simulation 100.

For each debugger 110-120 to be coupled to the simulation 100, the corresponding debugger adapter 125-135 couples the given debugger to the debugger server 105, at 210. The debugger server 105 assists the debugger adapters 125-135 in coupling their respective debuggers 110-120 to the simulation 100, at 215. In one implementation, when a given debugger 110 couples to the simulation, a debugger adapter 125 corresponding to the given debugger 110 registers with the debugger server 105. The registration may include choosing a unique name for each debugger 110-120. In one implementation, the debugger server 105 chooses the unique name for the particular debugger 110. The unique name will be used to maintain information about each debugger and communicating with the particular debugger 110 through its corresponding debugger adapter 125.

When a given debugger 110 couples to the simulation 100 its debugger adapter 125 may request an initial run state. The initial run state is used if no other debugger adapters 130, 135 are registered. The possible value of the requested initial run state may include retain, run, stop, and finish. In the retain mode, the former run state of the simulation is kept. Therefore, the given debugger becomes a stopper of the simulation if the simulation was stopped when the given debugger couples to the simulation. In the run mode, the given debugger becomes a no-stopper of the simulation. In the stop mode, the debugger adapter becomes a stopper of the simulation. In the finish mode, the given debugger becomes the requester for finishing the simulation.

The debugger server 105 maintains information about the run mode of debuggers that are coupled to the simulation, at 220. The debugger server 105 keeps track of the run mode of all its registered debugger adapters 125-135. Each time a debugger 110 changes its run mode, its debugger adapter 125 notifies the debugger server 105 about its new mode. A given debugger adapter 125 may cause its corresponding debugger 110 to change its run mode, for instance, because it reacts to a breakpoint hit. In the case of a user command, the debugger 110 instructs its debugger adapter 125 to change its run mode. The information maintained by the debugger server 105 about the current run mode of all coupled debugger adapters 125-135 is accessible to all currently coupled debugger adapters 125-135 or to any other interested entity. Therefore, a given debugger adapter 125 may retrieve information about the other debuggers 115, 120 coupled to the simulation 100, at 225. The information may include the unique names of all attached debuggers, the run mode of each attached debugger, all debuggers that are currently stopping the simulation, and/or the like. Each debugger adapter 125-135, for example, can query the information maintained by the debugger server 105 to collect a list of all debugger adapters 125-135 that are currently stopping the simulation.

Each debugger adapter may request one or more other debugger adapters to change their run mode, at 230. Possible requested run mode values include run, stop, step, and stall. In response thereto, the debugger server may coordinate between the debugger adapters 125-135 to drive the simulation into the requested run mode, at 235. For example, the debugger server 105 may request that all attached debugger adapters 125-135 enter a given run mode in response to a request from a given debugger adapter 125. The debugger server 105 forwards the requests to one or more applicable debugger adapters 125-135.

Each debugger adapter 125-135 may accept or reject a request to enter a given run mode, at 240. The debugger adapter may decide how to react to the change request or communicate the request to its corresponding debugger. The debugger may involve its user to decide how to react to the change request. The change to a given run mode only succeeds if all debugger adapters, current coupled to the simulation, confirm the request to change to the given run mode. The debugger server may optionally inform the given debugger adapter that initiated the procedure about the success of the procedure. The success or failure of the procedure may be indicated by a Boolean return value.

Accordingly, if one debugger adapter stops the simulation due to a breakpoint hit, watchpoint hit or the like in its simulation, the other debugger adapters can be driven to recognize that the simulation stopped. In response thereto, the other debugger adapters can change to a stop state and enable a user to evaluate the state of one or more simulation components utilizing one or more of the debuggers. Likewise, the procedure for driving the simulation into a given run mode enables the case where a user wants to continue the simulation from one debugger even if the simulation was stopped by another debugger.

Each debugger may un-couple from its respective debugger adapter and hence from the simulation, at 245. The debugger server 105 may delete the respective debuggers adapter during the un-coupling process, at 250.

If all debuggers 110-120 un-couple from the simulation 100, the debugger server 105 controls the run mode of the simulation after the last debugger uncouples, at 255. When a debugger un-couples and it is the last debugger adapter that was coupled to the debugger server 105, a requested follow-up run state parameter of the un-register procedure is evaluated to determine the follow-up run state of the simulation. Possible values of the parameter may include retain, run, stop and/or finish. The retain value is actual no-state at all but a request to keep the current state. If the simulation was stopped and the follow-up run state parameter has the value retain or stop, the responsibility of the stop state of the simulation is handled over from the last debugger adapter to the simulation stopper of the debugger server 105. If the parameter has the value finish, the simulation is finished. In all other cases the simulation is only stopped with the help of the simulation stopper of the debugger server 105 if the parameter has the value stop.

Control of the run state of the simulation after the last debugger uncouples by the debugger server, enables the simulation to be stopped or continued when the last debugger uncouples. Furthermore, if the simulation is stopped when the last server uncouples, the simulation can be continued by any debugger that subsequently attaches to the simulation.

Thus, the simulation 100 is always in a run state (e.g., it is running, stopped, finished or the like). A debugger adapter is operating in a run mode (e.g., stop, continue, step, stalled). Changing the mode of a debugger adapter may result in an adaptation of the run state of the simulation. The simulation will adapt its state accordingly to the run mode of all debuggers, but this is a transient procedure. For example, when a debugger switches from mode stop to mode run, the simulation may still be stopped by another debugger and not adapt its state immediately to running. When a debugger for example switches from run to stop the simulation may continue running for a short while until it finishes the current instruction of the simulation component that the debugger is attached to.

Figure 3:
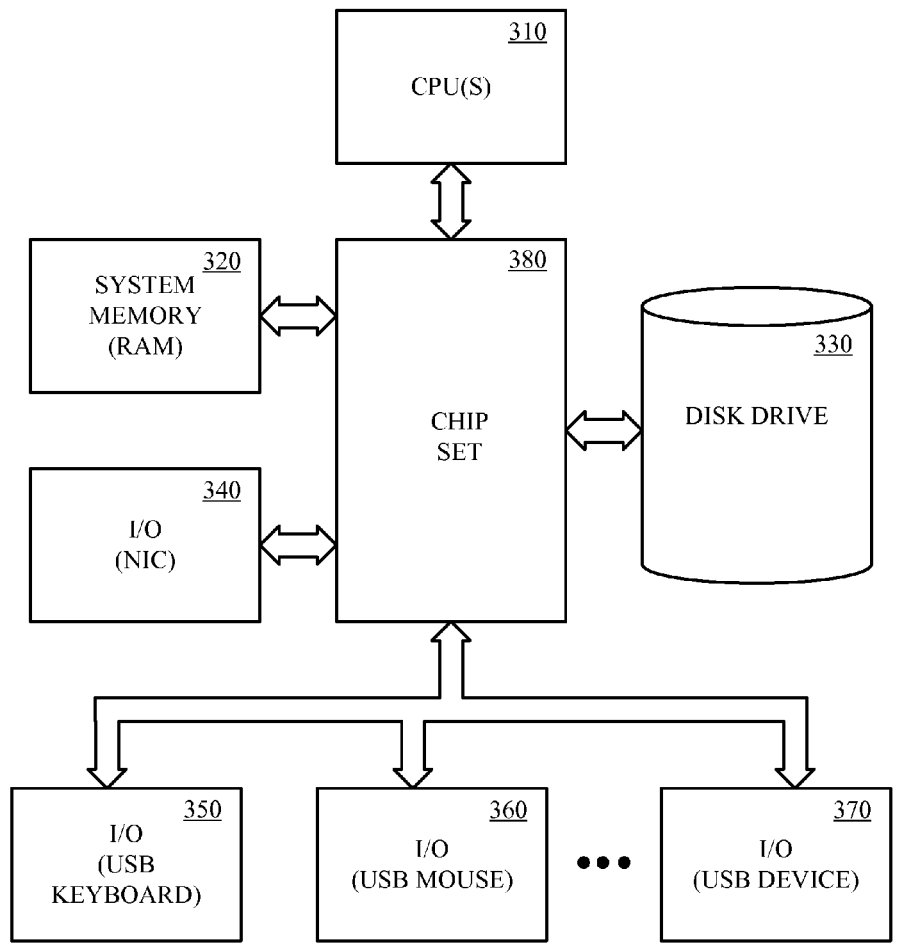
FIG. 3 shows a block diagram of an exemplary computing device for implementing embodiments of the present invention.

Referring now to FIG. 3, an exemplary computing device for implementing embodiments of the present invention is shown. The computing device 300 may be a local or remote device, such as an emulator, simulator, debugger, CAD system, ATE system, personal computer, server computer, client computer, laptop computer, hand-held device, minicomputer, mainframe computer, distributed computer system or the like. The computing device 300 includes one or more processors (e.g., CPU) 310, one or more computing device readable media 320, 330 and one or more input/output (I/O) devices 340, 350, 360, 370. The computing device readable media 320, 330, and I/O devices 340, 350, 360, 370 may be communicatively coupled to the processor 310 by a chip set 380 and one or more busses. The chipset 380 acts as a simple input/output hub for communicating data and instructions between the processor 310 and the computing device-readable media 320, 330, and I/O devices 340, 350, 360, 370.

The I/O devices 340, 350, 360, 370 may include one or more network interface cards 340, and peripherals such as a keyboard, a pointing device, a monitor, a speaker, a printer, and/or the like. The network interface card 340 provides for access to one or more other computing devices, networks and/or storage devices remote to the computing device 300.

Generally, local storage, such as a magnetic disk and/or optical disk, provides for non-volatile storage of computing device readable instructions and data for use by the computing device 300. For instance, the disk drive 330 may store an operating system (OS), applications and data. The system memory (e.g., RAM) 320 provides for volatile storage of computing device readable instructions and data for use by the computing device 300. For instance, the system memory 320 may temporarily store executing portions of the operating systems, one or more applications and associated data that are currently used by the CPU 310.

The above described method of coordinating multiple debuggers in a simulation environment may be embodied in computing device executable instructions stored on one or more computing device readable media 320, 330 coupled to one or more computing devices 300, and/or communicated to one or more computing devices 300 through one or more network interfaces 340. The instruction may be executed by one or more processor 310 on one or more computing devices 300 to implement that the method of coordinating multiple debuggers. In addition, the exemplary simulation environment described above may be implemented on one or more computing devices 300.

Embodiments of the present invention provide techniques for coordinating multiple debuggers in a simulation environment. A debugger server advantageously coordinates the run mode of the debugger clients through corresponding debugger adapters. Each debugger adapter advantageously controls the run mode of its respective debugger client by acting as a proxy for communicating with the debugger server. The debuggers advantageously have the freedom through their corresponding debugger adapters to accept or reject a request to change their run mode. This enables the implementation of convenient algorithms for deciding inside each of the debugger how to react on a request to change the run mode. It also makes it possible to involve a user in the process to determine the user's current intention.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A simulation environment comprising:
a non-transitory computer-readable storage medium storing executable modules comprising:
   a debugger server configured to:
      control a run mode of a simulation before any debugger client couples to the simulation, and
      coordinate run modes for debugger clients coupled to the simulation; and
   a first debugger adapter configured to:
      accept or reject a requested change in run mode for a first debugger client received from the debugger server, and
      request from the debugger server a change of run mode for a second debugger client, wherein the debugger server is coupled to the first debugger adapter and a second debugger adapter, the first debugger adapter coupled between the debugger server and the first debugger client, the second debugger adapter coupled between the debugger server and the second debugger client; and
a processor configured to execute the modules of the computer-readable storage medium.

2. The simulation environment of claim 1, wherein the debugger server maintains a unique name for the first debugger adapter and the second debugger adapter.

3. The simulation environment of claim 1, wherein the debugger server maintains a run mode of each debugger client coupled to the simulation.

4. The simulation environment of claim 1, wherein the debugger server maintains a unique name for the first debugger client and the second debugger client.

5. The simulation environment of claim 1, wherein the debugger server is configured to request a change in run mode for the first debugger client from the first debugger adapter.

6. The simulation environment of claim 5, wherein the debugger server requests the change in run mode for the first debugger client in response to receiving a request from the second debugger adapter for the change in run mode for the first debugger client.

7. The simulation environment of claim 1, wherein the debugger server is configured to request a change in run mode for the second debugger client in response to receiving a request from the first debugger adapter for the change in run mode for the second debugger client.

8. A method of coordinating debuggers in a simulation environment comprising:
controlling, by a debugger server, a run mode of a simulation prior to any debugger client coupling to the simulation;
coordinating, by the debugger server, run modes for debugger clients coupled to the simulation;
accepting or rejecting, by a first debugger adapter, a requested change in run mode for a first debugger client received from the debugger server; and
requesting, by the first debugger adapter, a change in run mode for a second debugger client from the debugger server;
wherein the debugger server is coupled to the first debugger adapter and a second debugger adapter, the first debugger adapter coupled between the debugger server and the first debugger client, the second debugger adapter coupled between the debugger server and the second debugger client.

9. The method of claim 8, further comprising:
receiving, by the debugger server from the first debugger adapter, the requested change in run mode for the second debugger client;
distributing, by the debugger server, the received requested change in run mode to the second debugger adapter; and
accepting or rejecting, by the second debugger adapter, the distributed requested change in run mode.

10. The method of claim 8, further comprising:
maintaining, by the debugger server, current run mode information for the first debugger adapter.

11. The method of claim 8, further comprising:
receiving, by the debugger server from the second debugger adapter, a requested change in run mode for a first debugger client; and
distributing, by the debugger server, the received requested change in run mode to the first debugger adapter.

12. The method of claim 8, further comprising:
un-coupling, by the debugger server, all debugger clients from the simulation.

13. The method of claim 12, further comprising:
controlling, by the debugger server, the run mode of the simulation after all debugger clients have been un-coupled from the simulation.

14. A method of controlling debuggers in a simulation environment comprising:
- controlling a run mode of a simulation prior to coupling any debugger clients to the simulation;
- coupling a first debugger client to a debugger server through a first debugger adapter;
- receiving a request for a change in run mode for the first debugger client from a second debugger adapter coupled to a second debugger client;
- modifying a simulation state based on the received request; and
- distributing the received request to the first debugger adapter, wherein the first debugger adapter is configured to accept or reject the requested change in run mode for the first debugger client;
- wherein the debugger server is coupled to the first debugger adapter and the second debugger adapter, the first debugger adapter coupled between the debugger server and the first debugger client, and the second debugger adapter coupled between the debugger server and the second debugger client.

15. The method of claim 14, further comprising:
- receiving, from the first debugger adapter, a second request for a change in run mode for the second debugger client coupled to the simulation; and
- distributing the received second request to the second debugger adapter.

16. The method of claim 14, further comprising:
- un-coupling all debugger clients from the simulation; and
- controlling the run mode of the simulation after all debugger clients have been un-coupled from the simulation.

17. The method of claim 14, further comprising:
- retrieving, by the first debugger adapter, run mode information of the second debugger adapter from the debugger server.

18. The method of claim 17, wherein retrieving run mode information of the second debugger adapter comprises determining that the second debugger adapter is currently stopping the simulation.

* * * * *